United States Patent
Chen et al.

(10) Patent No.: US 9,041,110 B2
(45) Date of Patent: May 26, 2015

(54) SEMICONDUCTOR DEVICE FOR ELECTROSTATIC DISCHARGE PROTECTION

(71) Applicant: UNITED MICROELECTRONICS CORP., Hsin-Chu (TW)

(72) Inventors: Lu-An Chen, Hsinchu County (TW); Tien-Hao Tang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/848,069

(22) Filed: Mar. 21, 2013

(65) Prior Publication Data

US 2014/0284720 A1    Sep. 25, 2014

(51) Int. Cl.
*H01L 23/62* (2006.01)
*H01L 29/78* (2006.01)
*H01L 27/02* (2006.01)
*H01L 29/08* (2006.01)
*H01L 23/60* (2006.01)

(52) U.S. Cl.
CPC ............ *H01L 29/78* (2013.01); *H01L 27/0266* (2013.01); *H01L 29/0847* (2013.01); *H01L 23/60* (2013.01)

(58) Field of Classification Search
CPC .. H01L 27/0266; H01L 29/0847; H01L 29/78; H01I 23/60
USPC ................................................. 257/355, 360
See application file for complete search history.

(56) References Cited

U.S. PATENT DOCUMENTS

| | | | |
|---|---|---|---|
| 7,135,743 B2 * | 11/2006 | Manna et al. | 257/357 |
| 7,190,030 B1 * | 3/2007 | Cheng et al. | 257/355 |
| 7,655,980 B1 | 2/2010 | Chao et al. | |
| 8,384,184 B2 * | 2/2013 | Khan et al. | 257/492 |
| 8,530,969 B2 * | 9/2013 | Chen et al. | 257/356 |
| 2013/0207184 A1 * | 8/2013 | Chen et al. | 257/339 |

* cited by examiner

*Primary Examiner* — Howard Weiss
(74) *Attorney, Agent, or Firm* — Winston Hsu; Scott Margo

(57) ABSTRACT

A semiconductor device includes a substrate, a gate positioned on the substrate, a drain region and a source region formed at respective two sides of the gate in the substrate, at least a first doped region formed in the drain region, and at least a first well having the first doped region formed therein. The source region and the drain region include a first conductivity type, the first doped region and the first well include a second conductivity type, and the first conductivity type and the second conductivity type are complementary to each other.

6 Claims, 5 Drawing Sheets

SEMICONDUCTOR DEVICE FOR ELECTROSTATIC DISCHARGE PROTECTION

BACKGROUND OF THE INVENTION

1. Field of the Invention

The invention relates to a semiconductor device, and more particularly, to a semiconductor device for electrostatic discharge (hereinafter abbreviated as ESD) protection.

2. Description of the Prior Art

Chips and/or Integrated circuits (ICs) are the most essential hardware foundation of the modern information society. As products based on ICs become more delicate, they also become more vulnerable to the impacts of the external environment. For example, it is found that ESD is a constant threat to modern electronics. The result of ESD on unprotected ICs is often destruction, characterized by melting or explosion of a part of the ICs. Therefore, the ESD protection devices are taken as important components of the protection circuitry provided in today's electronic devices.

Various approaches have been made to provide an ESD protection device associated with IC interface pads to prevent a core circuit of the ICs from the ESD damages. Typically, during a normal IC operation, the ESD protection device is turned off. However when an ESD event occurs, the ESD surges will cause the ESD protection device breakdown and create a substrate current path, through which the ESD current is diverted to ground and thus the core circuit is protected. The maximum withstanding voltage is the most important concern of high voltage device such as the ESD device. As the dimensional size of the semiconductor device is becoming smaller and smaller, it is getting more and more difficult to improve the maximum withstanding voltage. Furthermore, there is another problem for the ESD protection device that is the leakage may occur between the gate and the source/drain.

In view of the above, there exists a need for an ESD protection device having improved withstanding voltage and reduced current leakage.

SUMMARY OF THE INVENTION

According to the claimed invention, a semiconductor device is provided. The semiconductor device includes a substrate, a gate positioned on the substrate, a drain region and a source region formed at respective two sides of the gate in the substrate, at least a first doped region formed in the drain region, and at least a first well having the first doped region formed therein. The source region and the drain region include a first conductivity type, the first doped region and the first well include a second conductivity type, and the first conductivity type and the second conductivity type are complementary to each other.

According to the claimed invention, another semiconductor device is provided. The semiconductor device includes a substrate, a gate positioned on the substrate, a drain region and a source region formed at respective two sides of the gate in the substrate, and a first doped region formed under the drain region. The source region and the drain region include a first conductivity type and the first doped region includes a second conductivity type. More important, an area of the first doped region is smaller than an area of the drain region.

According to the semiconductor devices provided by the present invention, the first doped region is inserted in the drain region or formed under the drain region. Accordingly, the electric field is pushed off from the edge of the gate. In other words, the semiconductor device provided by the present invention efficiently avoids the maximum electric fields crowding on surface of gate dielectric layer. Therefore, current leakage is avoided and the withstanding voltage of the provided semiconductor device is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
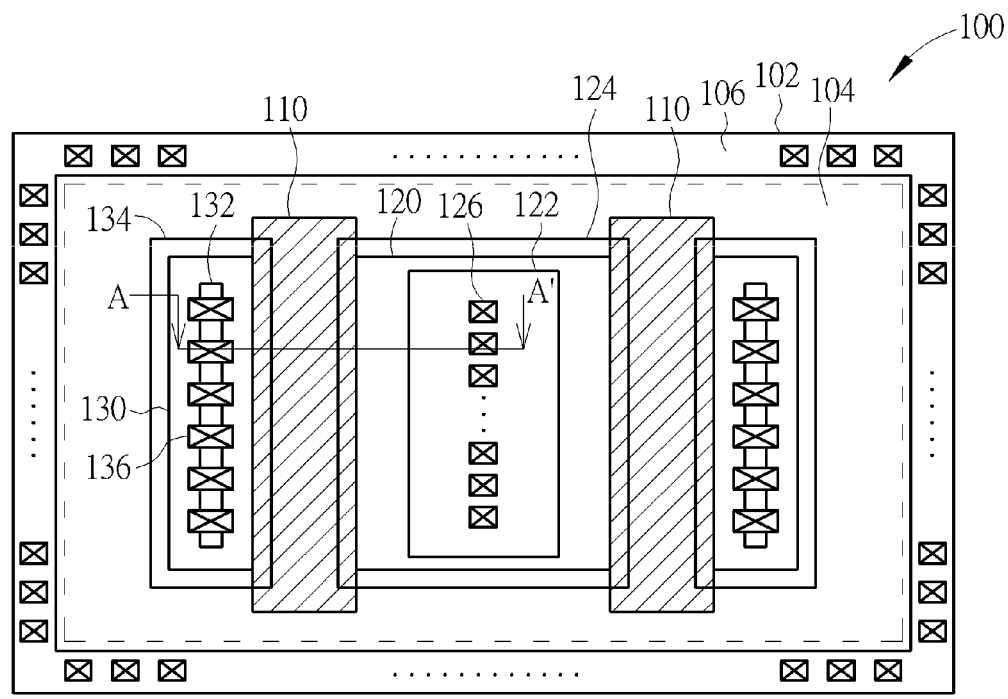
FIG. 1 is a schematic drawing illustrating a semiconductor device provided by a first preferred embodiment of the present invention.
Figure 2:
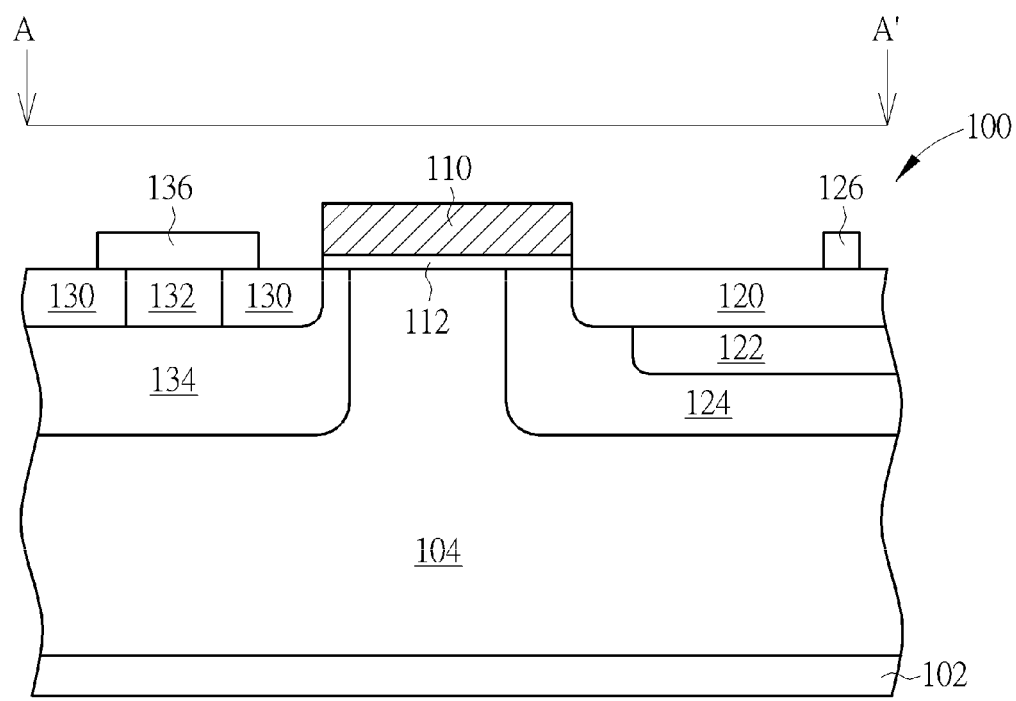
FIG. 2 is a cross-sectional view take along Line A-A' of FIG. 1.

Please refer to FIGS. 1-2, wherein FIG. 1 is a schematic drawing illustrating a semiconductor device provided by a first preferred embodiment of the present invention, and FIG. 2 is a cross-sectional view take along Line A-A' of FIG. 1. As shown in FIGS. 1-2, the semiconductor device 100 for ESD protection includes a substrate 102 having a deep well 104 formed therein. The deep well 104 includes a first conductivity type and the substrate 102 includes a second conductivity type, and the first conductivity type and the second conductivity type are complementary to each other. In the preferred embodiment, the first conductivity type is n type and the second conductivity type is p type. Additionally, the semiconductor device 100 can further include a guard ring 106 (shown in FIG. 1) having the second conductivity type.

Please still refer to FIGS. 1-2. The semiconductor device 100 provided by the preferred embodiment includes a gate 110 positioned on the substrate 102, and the gate 110 includes an isolation structure such as a gate dielectric layer 112. The semiconductor device 100 also includes a drain region 120 and a source region 130. The drain region 120 and the source region 130 are formed at respective two sides of the gate 110 in the substrate 102 and include the first conductivity type. The semiconductor device 100 further includes a first doped region 122 formed under the drain region 120. More important, an area of the first doped region 122 is smaller than an area of the drain region 120, and a depth of the first doped region 122 is larger than a depth of the drain region 120 as shown in FIGS. 1-2. For example but not limited to, the depth of the first doped region 122 can be 300 nanometer (nm) to 500 nm. The first doped region 122 includes the second conductivity type. Additionally, the first doped region 122 preferably is a heavily doped region. The semiconductor device 100 further includes a second doped region 124 having the first conductivity type. As shown in FIGS. 1-2, the drain region 120 and the first doped region 122 are all formed in and encompassed by the second doped region 124. Additionally, the gate 110 covers a portion of the second doped region 124.

In the source side, the semiconductor device 100 includes a third doped region 132 having the second conductivity type formed in the source region 130. The semiconductor device 100 further includes a fourth doped region 134 having the second conductivity type and serves as a body region. As shown in FIGS. 1-2, the source region 130 and the third doped region 132 are formed in the fourth doped region 134, and the gate 110 covers a portion of the fourth doped region 134.

Accordingly, the second doped region 124 (with the drain region 120 and the first doped region 122 formed therein) and the fourth doped region 134 (with the source region 130 and the third doped region 132 formed therein) are all formed in the deep well 104. The semiconductor device 100 further includes a plurality of first contacts 126 electrically connected to the drain region 120 and a plurality of second contacts 136 electrically connected to the source region 130 and the third doped region 132. Additionally, the second contacts 136 preferably include butting contacts, but not limited to this.

According to the semiconductor device 100 provided by the first preferred embodiment, the first doped region 122 is provided at the drain side, and thus a high-voltage n-type metal-oxide-semiconductor (HVNMOS) embedded silicon controlled rectified (SCR) structure is obtained. During the operation, a first doped region 120, the deep well 104, the fourth doped region 134, and the source region 130 construct a SCR path, and more ESD current can be diverted. Compared with the ESD protection device in the prior art, which includes no first doped region under the drain region, a minimum voltage of a human body model (hereinafter abbreviated as HBM) test of the semiconductor device 100 provided by the preferred embodiment is increased from 3 kV to 8 kV and a minimum voltage of a machine model (hereinafter abbreviated as MM) test is increased from 125V to 550V. Briefly speaking, the withstanding voltage of the semiconductor device 100 is increased and thus the ESD protection rendered by the semiconductor device 100 is improved.

Figure 3:
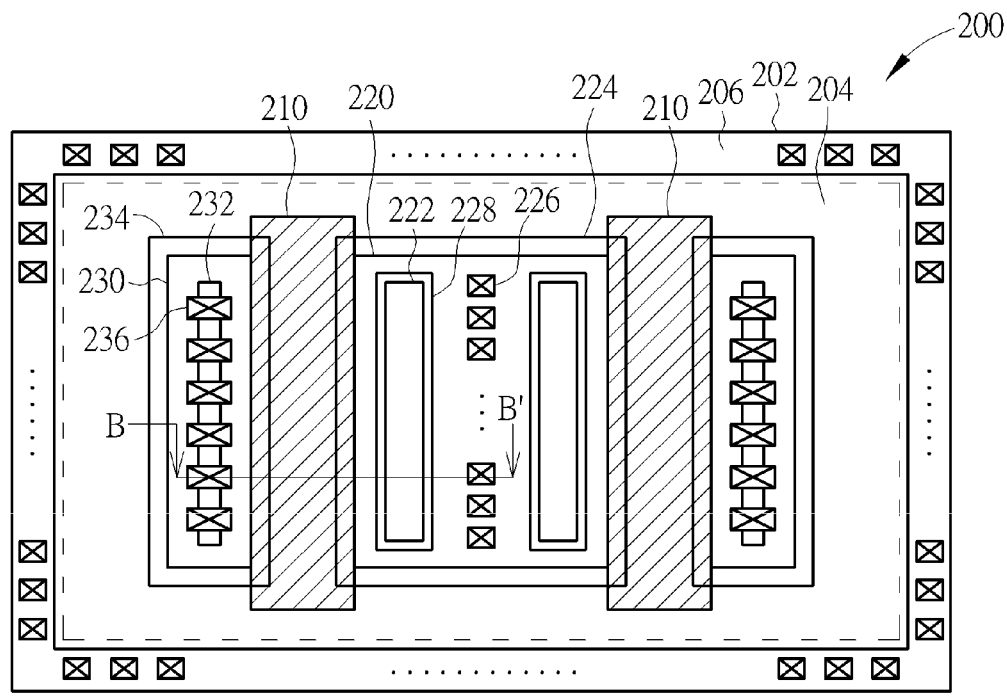
FIG. 3 is a schematic drawing illustrating a semiconductor device provided by a second preferred embodiment of the present invention.
Figure 4:
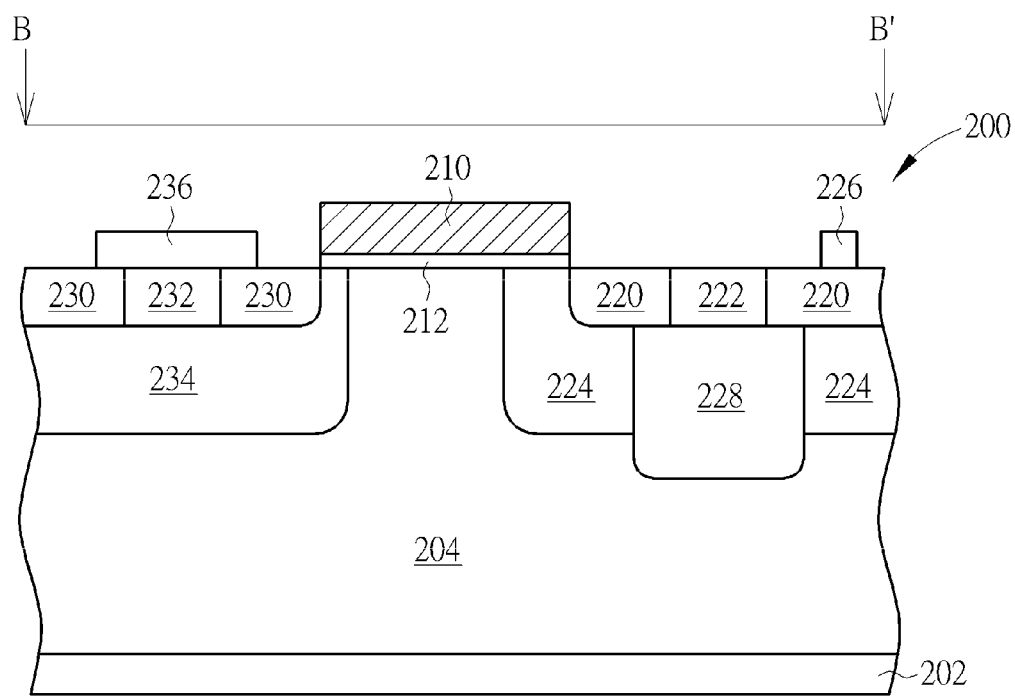
FIG. 4 is a cross-sectional view take along Line B-B' of FIG. 3.

Please refer to FIGS. 3-4, wherein FIG. 3 is a schematic drawing illustrating a semiconductor device provided by a second preferred embodiment of the present invention and FIG. 4 is a cross-sectional view take along Line B-B' of FIG. 3. It should be noted that the elements the same in both first and second preferred embodiments include the same conductivity type, and thus those details are omitted herein in the interest of brevity. As shown in FIGS. 3-4, the semiconductor device 200 for ESD protection includes a p-typed substrate 202 having an n-typed deep well 204 formed therein. Additionally, the semiconductor device 200 can further include a p-typed guard ring 206.

Please still refer to FIGS. 3-4. The semiconductor device 200 provided by the preferred embodiment includes a gate 210 positioned on the substrate 202, and the gate 210 includes an isolation structure such as gate dielectric layer 212. The semiconductor device 200 also includes a drain region 220 and a source region 230. The drain region 220 and the source region 230 are formed at respective two sides of the gate 210 in the substrate 202. The drain region 220 and the source region 230 respectively are n-typed drain region 220 and n-typed source region 230. The semiconductor device 200 further includes at least a p-typed first doped region 222 and at least a p-typed first well 228 having the first doped region 222 formed therein. Additionally, the first doped region 222 preferably is a heavily doped region, and the first well 228 preferably is a lightly doped region. The first doped region 222 is a floating region as shown in FIGS. 3-4. The semiconductor device 200 further includes an n-typed second doped region 224 formed under the drain region 220. As shown in FIGS. 3-4, the first doped region 222 is formed in the first well 228 while the drain region 220, the first doped region 222, and the first well 228 are all formed in the second doped region 224 in the substrate-horizontal direction. In the substrate-thickness direction, a depth of the first doped region 222 is the same with a depth of the drain region 220, and a depth of the first well 228 is larger than the depth of the first doped region 222, even larger than a depth of the second doped region 224. For example but not limited to, the depth of the first doped region 222 can be 50 nm to 200 nm, and the depth of the first well 228 can be 1000 nm to 2000 nm. Additionally, the gate 210 covers a portion of the second doped region 224.

In the source side, the semiconductor device 200 includes a p-typed third doped region 232 formed in the source region 230. The semiconductor device 200 further includes a p-typed fourth doped region 234 serves as a body region. As shown in FIGS. 3-4, the source region 230 and the third doped region 232 are formed in the fourth doped region 234, and the gate 210 covers a portion of the fourth doped region 234.

Accordingly, the second doped region 224 (with the drain region 220 and the first doped region 222 formed therein), the fourth doped region 234 (with the source region 230 and the third doped region 232 formed therein), and the first well 228 are all formed in the deep well 204. The semiconductor device 200 further includes a plurality of first contacts 226 electrically connected to the drain region 220 and a plurality of second contacts 236 electrically connected to the source region 230 and the third doped region 232. Additionally, the second contacts 236 preferably include butting contacts, but not limited to this. More important, the first doped region 222 and the first well 228 are all formed between the first contacts 226 and the gate 210 as shown in FIGS. 3-4.

Figure 5:
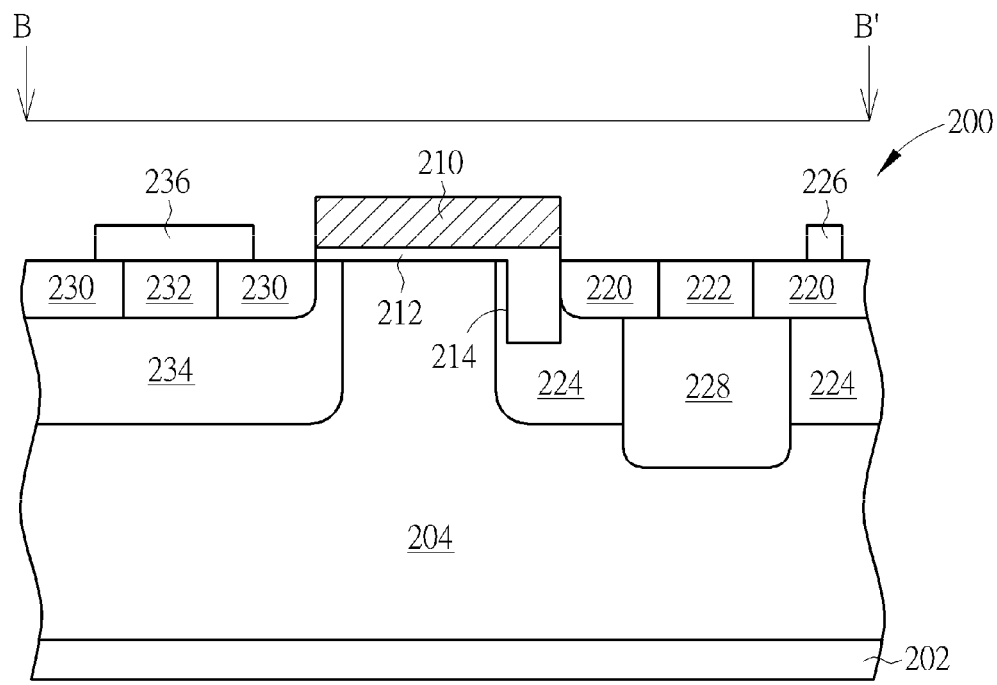
FIG. 5 is a schematic drawing illustrating a modification to the semiconductor device provided by the second preferred embodiment.

Please refer to FIG. 5, which is a schematic drawing illustrating a modification to the semiconductor device 200 provided by the second preferred embodiment. According to the modification, a recess 214 can be formed in the second doped region 224 and filled up with an isolation material to form the isolation structure 212. Therefore, a portion of the isolation structure 212 is extended downward into the second doped region 224 as shown in FIG. 5.

According to the semiconductor device 200 provided by the second preferred embodiment and the modification, the floating first doped region 222 is inserted in the drain region 220, which is the anode side. Therefore electric fields generated during operation are pushed off from the edge between the isolation structure 212 and the drain region 220 to the first doped region 222. In other words, the floating first doped region 222 helps to shift the electric fields from the drain region 220/the second doped region 224 to the drain region 220/the first doped region 222. Consequently, the semiconductor device 200 provided by the second preferred embodiment and modification efficiently avoids the maximum electric fields crowding on the gate dielectric layer 212. Therefore, current leakage is avoided and the withstanding voltage of the provided semiconductor device 200 is improved.

Compared with the ESD protection device in the prior art, which includes no first doped region and no first well, a minimum voltage of a HBM test of the semiconductor device 200 provided by the preferred embodiment is increased from 3 kV to 8 kV and a minimum voltage of a MM test is increased from 125V to 750V. Briefly speaking, the withstanding voltage the semiconductor device 200 is increased and thus the ESD protection rendered by the semiconductor device 200 is improved. Furthermore, the first doped region 222 can be formed with the same photomask for forming the third doped region 232, and the first well 228 can be formed with the same photomask for forming the fourth doped region 234 or the same photomask for forming p-well region in any other low voltage (LV) semiconductor device. Accordingly, the semiconductor device 200 provided by the second preferred embodiment and the modification can be easily integrated in the fabrication process in state-of-the-art without increasing process cost and process complexity.

Figure 6:
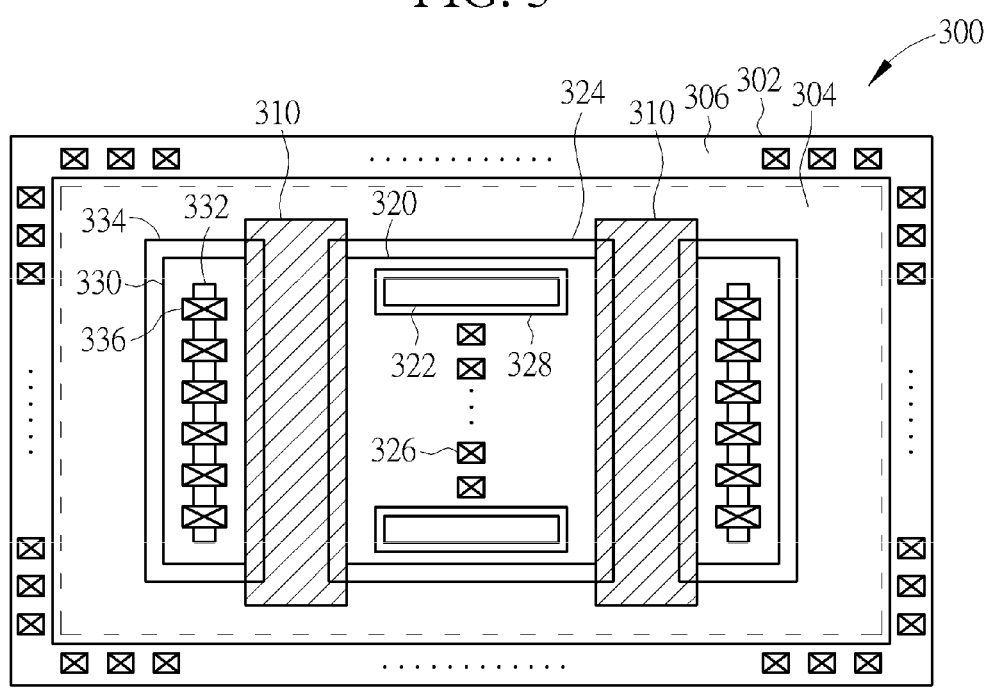
FIG. 6 is a schematic drawing illustrating a semiconductor device provided by a third preferred embodiment.
Figure 7:
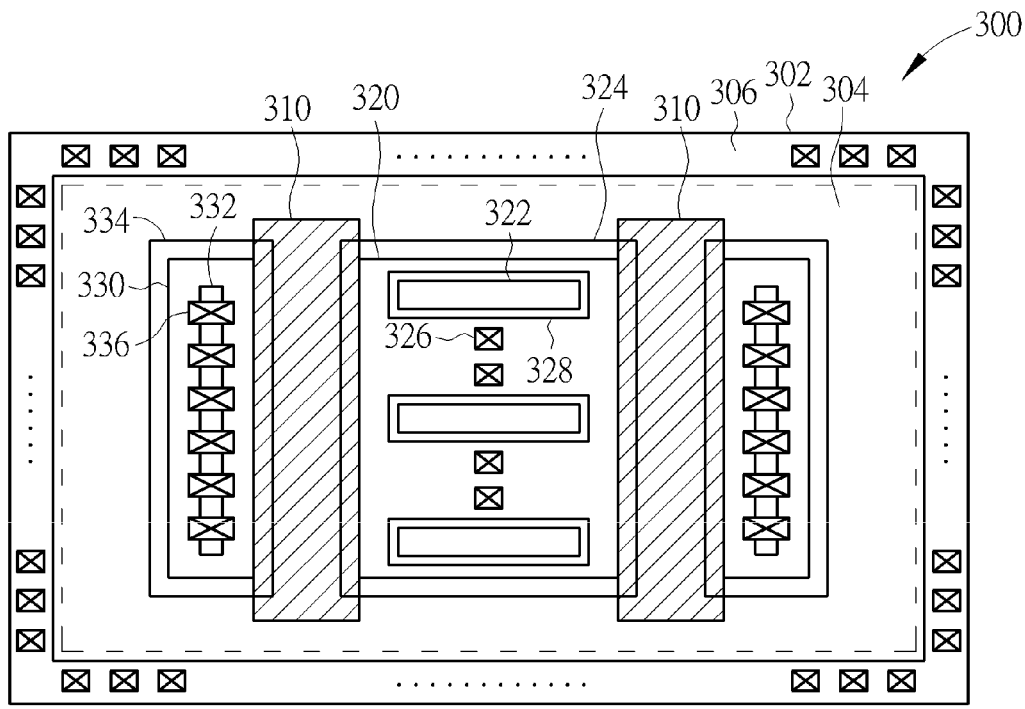
FIG. 7 is a schematic drawing illustrating a semiconductor device provided by a fourth preferred embodiment of the present invention.

Please refer to FIGS. 6 and 7, wherein FIG. 6 is a schematic drawing illustrating a semiconductor device provided by a third preferred embodiment and FIG. 7 is a schematic drawing illustrating a semiconductor device provided by a fourth preferred embodiment of the present invention. It should be noted that elements the same in the third, the fourth, and the aforementioned preferred embodiments include the same conductivity type, and thus those details are omitted herein in the interest of brevity. Furthermore, elements the same in the third and fourth preferred embodiments are designated by the same numerals.

As shown in FIGS. 6-7, the semiconductor device 300 for ESD protection includes a p-typed substrate 302 having an n-typed deep well 304 formed therein. Additionally, the semiconductor device 300 can further include a p-typed guard ring 306. The semiconductor device 300 provided by the preferred embodiment includes a gate 310 positioned on the substrate 302 and the gate 310 includes an isolation structure such as gate dielectric layer (not shown). The semiconductor device 300 also includes an n-typed drain region 320 and an n-typed source region 330. The drain region 320 and the source region 330 are formed at respective two sides of the gate 310 in the substrate 302. The semiconductor device 300 further includes at least a p-typed first doped region 322 and at least a p-typed first well 328 having the first doped region 322 formed therein. In the third preferred embodiment, a pair of first doped regions 322 is provided at two respective ends of the drain region 320, and an extending direction of the first doped regions 322 is perpendicular to an extending direction of the gate 310 as shown in FIG. 6. In the fourth preferred embodiment, a plurality of first doped regions 322 is provided in the drain region 320. Also, an extending direction of the first doped regions 322 is perpendicular to an extending direction of the gate 310 as shown in FIG. 7. Furthermore, a number of the first well 328 is corresponding to a number of the first doped region 322, and the first wells 328 are formed correspondingly under the first doped region 322. The first doped regions 322 are floating regions as shown in FIGS. 6-7. The semiconductor device 300 further includes an n-typed second doped region 324. As shown in FIGS. 6-7, the drain region 320, the first doped regions 322, and the first wells 328 are all formed in the second doped region 324 in the substrate-horizontal direction. In the substrate-thickness direction, a depth of the first doped regions 322 is the same with a depth of the drain region 320, and a depth of the first wells 328 is larger than the depth of the first doped regions 322, even larger than a depth of the second doped region 324. For example but not limited to, the depth of the first doped regions 322 can be 50 nm to 200 nm, and the depth of the first wells 328 can be 1000 nm to 2000 nm. Additionally, the gate 310 covers a portion of the second doped region 324.

In the source side, the semiconductor device 300 includes a p-typed third doped region 332 formed in the source region 330. The semiconductor device 300 further includes a p-typed fourth doped region 334 serves as a body region. As shown in FIGS. 6-7, the source region 330 and the third doped region 332 are formed in the fourth doped region 334, and the gate 310 covers a portion of the fourth doped region 334. Accordingly, the second doped region 324 (with the drain region 320 and the first doped regions 322 formed therein), the fourth doped region 334 (with the source region 330 and the third doped region 332 formed therein), and the first wells 328 are all formed in the deep well 304.

As shown in FIGS. 6-7, the semiconductor device 300 further includes a plurality of first contacts 326 electrically connected to the drain region 320 and a plurality of second contacts 336 electrically connected to the source region 330 and the third doped region 332. Additionally, the second contacts 336 preferably include butting contacts, but not limited to this. More important, the first contacts 326 are all arranged between the first doped regions 322 as shown in FIGS. 6-7.

Additionally, a recess (not shown) can be formed in the second doped region 324 and filled up with an isolation material to form the isolation structure. Therefore, a portion of the isolation structure is extended downward into the second doped region 324 as mentioned above.

According to the semiconductor device 300 provided by the third preferred embodiment and the fourth preferred embodiment, the floating first doped regions 322 are inserted in the drain region 320, which is the anode side. Therefore electric fields generated during operation are pushed off from the edge between the isolation structure and the drain region 320 to the first doped region 322. In other words, the semiconductor device 300 efficiently avoids the maximum electric fields crowding on surface of gate dielectric layer. Therefore, current leakage is avoided and the withstanding voltage of the provided semiconductor device 300 is improved. As mentioned above, the first doped regions 322 can be formed with the same photomask for forming the third doped region 332, and the first wells 328 can be formed with the same photomask for forming the fourth doped region 334 or the same photomask for forming p-well region in any LV semiconductor device. Accordingly, the semiconductor device 300 can be easily integrated in the fabrication process in state-of-the-art without increasing process cost and process complexity.

Figure 8:
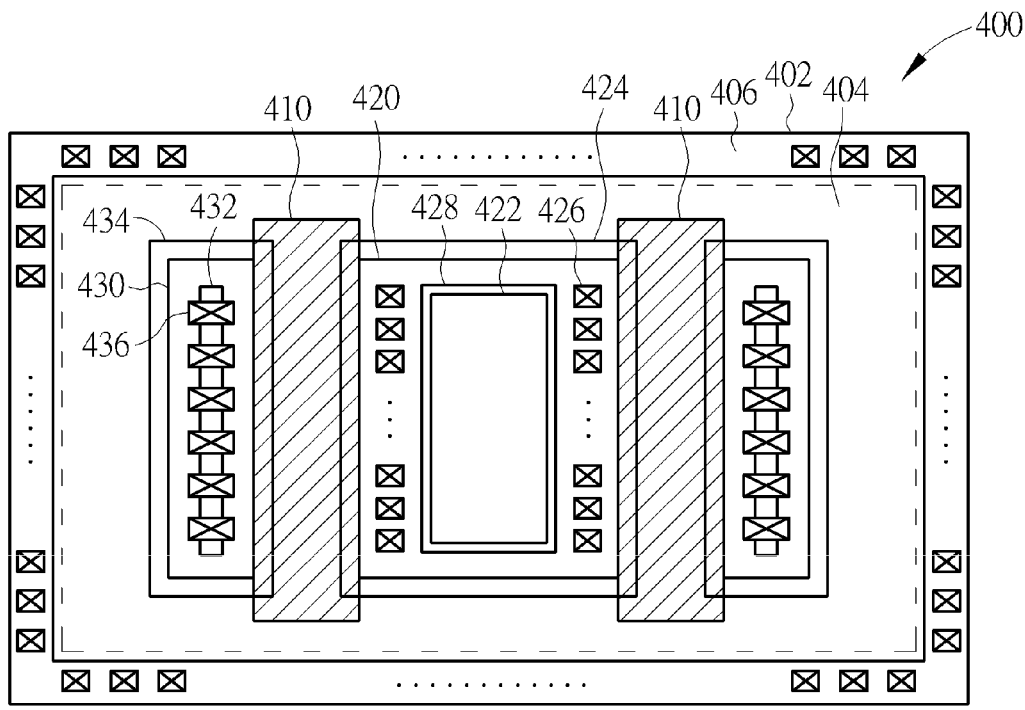
FIG. 8 is a schematic drawing illustrating a semiconductor device provided by a fifth preferred embodiment of the present invention.

Please refer to FIG. 8, which is a schematic drawing illustrating a semiconductor device provided by a fifth preferred embodiment of the present invention. It should be noted that elements the same in the fifth and the aforementioned preferred embodiments include the same conductivity type, and thus those details are omitted herein in the interest of brevity.

As shown in FIG. 8, the semiconductor device 400 for ESD protection includes a p-typed substrate 402 having an n-typed deep well 404 formed therein. Additionally, the semiconductor device 400 can further include a p-typed guard ring 406. The semiconductor device 400 provided by the preferred embodiment includes a gate 410 positioned on the substrate 402, and the gate 410 includes an isolation structure such as gate dielectric layer (not shown). The semiconductor device 400 also includes an n-typed drain region 420 and an n-typed source region 430. The drain region 420 and the source region 430 are formed at respective two sides of the gate 410 in the substrate 402. The semiconductor device 400 further includes at least a p-typed first doped region 422 and at least a p-typed first well 428 having the first doped region 422 formed therein. In the fifth preferred embodiment, only one first doped region 422 is provided at the center of the drain region 420, and the first doped region 422 is a floating region as shown in FIG. 8. The semiconductor device 400 further includes an n-typed second doped region 424. As shown in FIG. 8, the drain region 420, the first doped regions 422, and the first wells 428 are all formed in the second doped region 424 in the substrate-horizontal direction. In the substrate-thickness direction, a depth of the first doped region 422 is the same with a depth of the drain region 420, and a depth of the first well 428 is larger than the depth of the first doped region 422, even larger than a depth of the second doped region 424. Additionally, the gate 410 covers a portion of the second doped region 424.

In the source side, the semiconductor device 400 includes a p-typed third doped region 432 formed in the source region 430. The semiconductor device 400 further includes a p-typed fourth doped region 434 serving as a body region. As shown in FIG. 8, the source region 430 and the third doped region 432 are formed in the fourth doped region 434, and the gate 410 covers a portion of the fourth doped region 434. Accordingly, the second doped region 424 (with the drain region 420 and the first doped region 422 formed therein), the fourth doped region 434, (with the source region 430 and the third doped region 432 formed therein), and the first well 428 are all formed in the deep well 404.

As shown in FIG. 8, the semiconductor device 400 further includes a plurality of first contacts 426 electrically connected to the drain region 420 and a plurality of second contacts 436 electrically connected to the source region 430 and the third doped region 432. Additionally, the second contacts 436 preferably include butting contacts, but not limited to this. More important, the first contacts 426 are all arranged between the first doped region 422 and the gate 410 as shown in FIG. 8.

Additionally, a recess (not shown) can be formed in the second doped region 424 and filled up with an isolation material to form the isolation structure. Therefore, a portion of the isolation structure is extended downward into the second doped region 424.

According to the semiconductor device 400 provided by the fifth embodiment, the floating first doped region 422 is inserted in the drain region 420, which is the anode side. Therefore electric fields generated during operation are pushed off from the edge between the isolation structure and the drain region 420 to the first doped region 422. In other words, the semiconductor device 400 provided by the fifth preferred embodiment avoids the maximum electric fields crowding on surface of gate dielectric layer. Therefore, current leakage is avoided and the withstanding voltage of the provided semiconductor device 400 is improved. As mentioned above, the first doped region 422 can be formed with the same photomask for forming the third doped region 432, and the first well 428 can be formed with the same photomask for forming the fourth doped region 434 or the same photomask for forming p-well region in any LV semiconductor device. Accordingly, the semiconductor device 400 can be easily integrated in the fabrication process in state-of-the-art without increasing process cost and process complexity.

Figure 9:
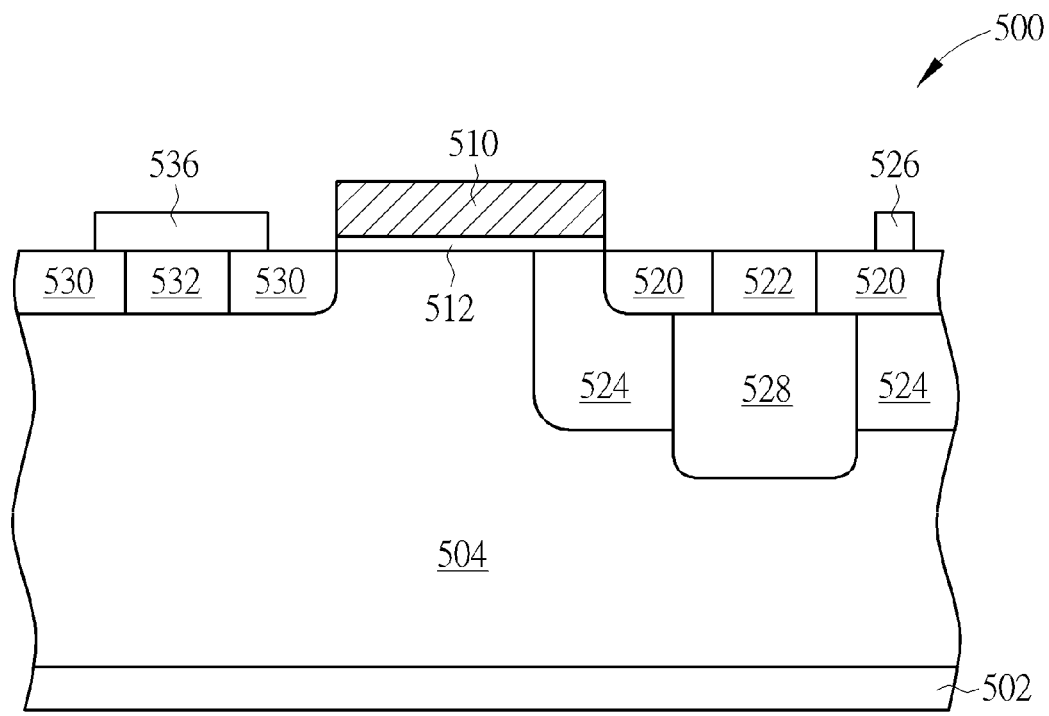
FIG. 9 is a schematic drawing illustrating a semiconductor device provided by a sixth preferred embodiment of the present invention.
Figure 10:
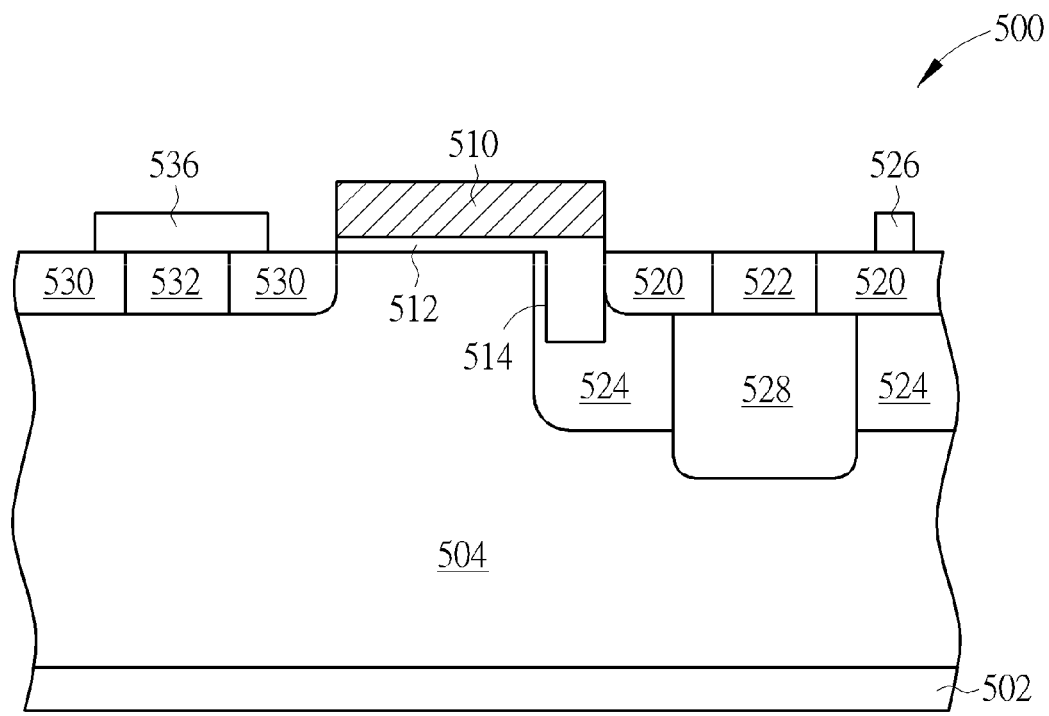
FIG. 10 is a schematic drawing illustrating a modification to the sixth preferred embodiment of the present invention.

Please refer to FIGS. 9-10, wherein FIG. 9 is a schematic drawing illustrating a semiconductor device provided by a sixth preferred embodiment provided by the present invention and FIG. 10 is a schematic drawing illustrating a modification to the sixth preferred embodiment. It should be noted that elements the same in the sixth and the aforementioned preferred embodiments include the same conductivity type, and thus those details are omitted herein in the interest of brevity.

As shown in FIG. 9, the semiconductor device 500 for ESD protection includes a substrate 502 having a p-typed deep well 504 formed therein. It is noteworthy that the deep well 504 provided by the preferred embodiment is a high voltage p-type well (HVPW). Additionally, the semiconductor device 500 can further include a p-typed guard ring (not shown). The semiconductor device 500 provided by the preferred embodiment includes a gate 510 positioned on the substrate 502, and the gate 510 includes an isolation structure such as gate dielectric layer 512. The semiconductor device 500 also includes an n-typed drain region 520 and an n-typed source region 530. The drain region 520 and the source region 530 are formed at respective two sides of the gate 510 in the substrate 502. The semiconductor device 500 further includes at least a p-typed first doped region 522 formed therein and at least a p-typed first well 528 formed under the first doped region 520. It is noteworthy that in the sixth preferred embodiment, the amount and arrangement of the first doped region(s) 522 can be modified as mention in the second, the third, the fourth, and the fifth preferred embodiments, and so are the amount and arrangement of first well(s) 528. Therefore those details are omitted for simplicity. As mentioned above, the first doped region(s) 522 are floating regions as shown in FIG. 9. The semiconductor device 500 further includes an n-typed second doped region 524. As shown in FIG. 9, the drain region 520, the first doped regions 522, and the first wells 528 are all formed in the second doped region 524 in the substrate-horizontal direction. In the substrate-thickness direction, a depth of the first doped region 522 is the same with a depth of the drain region 520, and a depth of the first well 528 is larger than the depth of the first doped region 522, even larger than a depth of the second doped region 524. Additionally, the gate 510 covers a portion of the second doped region 524. In the source side, the semiconductor device 500 includes a p-typed third doped region 532 formed in the source region 530.

As shown in FIG. 9, the semiconductor device 500 further includes a plurality of first contacts 526 electrically connected to the drain region 520 and a plurality of second contacts 536 electrically connected to the source region 530 and the third doped region 532. Additionally, the second contacts 536 preferably include butting contacts, but not limited to this. More important, arrangement of the first contacts 526 can be modified according to different arrangements of the first doped region(s) 522 as mentioned above.

Please refer to FIG. 10, which is a modification to the semiconductor device provided by the sixth preferred embodiment. According to the modification, a recess 514 can be formed in the second doped region 524 and filled up with an isolation material to form the isolation structure 512. Therefore, a portion of the isolation structure 512 is extended downward into the second doped region 524 as shown in FIG. 10.

According to the semiconductor device 500, which is a drain-extended nMOS (DENMOS), provided by the sixth preferred embodiment and the modification, the floating first doped region(s) 522 is inserted in the drain region 520, which is the anode side. Therefore electric fields generated during operation are pushed off from the edge between the isolation structure 512 and the drain region 520 to the first doped region 522. In other words, the semiconductor device 500 provided by the sixth preferred embodiment avoids the maximum electric fields crowding on surface of gate dielectric layer 512.

Therefore, current leakage is avoided and the withstanding voltage of the provided semiconductor device 500 is improved.

According to the semiconductor devices provided by the present invention, the first doped region is inserted in the drain region or formed under the drain region. Accordingly, the electric field is pushed off from the edge of the gate. In other words, the semiconductor device provided by the present invention efficiently avoids the maximum electric fields crowding on surface of gate dielectric layer. Therefore, current leakage is avoided and the withstanding voltage of the provided semiconductor device is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate;
   a gate positioned on the substrate;
   a drain region and a source region having a first conductivity type formed at respective two sides of the gate in the substrate;
   a first doped region having a second conductivity type formed under the drain region, an area of the first doped region is smaller than an area of the drain region; and
   a second doped region having the first conductivity type formed in the substrate,
   wherein an entire bottom surface and entire side surfaces of the first doped region contact the second doped region.

2. The semiconductor device according to claim 1, wherein the first conductivity type and the second conductivity type are complementary to each other.

3. The semiconductor device according to claim 1, wherein the drain region and the first doped region are all formed in the second doped region.

4. The semiconductor device according to claim 3, wherein the first doped region is encompassed by the second doped region.

5. The semiconductor device according to claim 1, further comprising a third doped region having the second conductivity type formed in the source region and a fourth doped region having the second conductivity type, and the source region and the third doped region are formed in the fourth doped region.

6. The semiconductor device according to claim 5, further comprising a deep well having the first conductivity type, and the second doped region and the fourth doped region are formed in the deep well.

* * * * *